United States Patent
Brodsky

(10) Patent No.: US 6,743,026 B1
(45) Date of Patent: Jun. 1, 2004

(54) PRINTED WIRING BOARD THICKNESS CONTROL FOR COMPRESSION CONNECTORS USED IN ELECTRONIC PACKAGING

(75) Inventor: William L. Brodsky, Binghamton, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/414,538

(22) Filed: Apr. 15, 2003

(51) Int. Cl.⁷ .................................. H05K 1/00
(52) U.S. Cl. ......................... 439/73; 361/719
(58) Field of Search ............. 439/66, 73, 331; 361/719, 720; 29/832; 257/718, 719, 720, 727

(56) References Cited

U.S. PATENT DOCUMENTS

| | | | |
|---|---|---|---|
| 5,473,510 A | 12/1995 | Dozier, II | 361/719 |
| 5,528,462 A * | 6/1996 | Pendse | 361/767 |
| 5,703,753 A | 12/1997 | Mok | 361/715 |
| 5,883,782 A * | 3/1999 | Thurston et al. | 361/704 |
| 5,958,556 A | 9/1999 | McCutcheon | 428/172 |
| 6,217,988 B1 | 4/2001 | Yasue et al. | 428/209 |
| 6,377,465 B1 | 4/2002 | Tanaka | 361/760 |
| 6,386,890 B1 * | 5/2002 | Bhatt et al. | 439/67 |
| 6,654,250 B1 * | 11/2003 | Alcoe | 361/719 |
| 2002/0129951 A1 | 9/2002 | Babb et al. | 174/35 R |
| 2002/0129957 A1 | 9/2002 | Kolb | 174/52 |
| 2002/0129971 A1 | 9/2002 | Kolb et al. | 174/256 |

FOREIGN PATENT DOCUMENTS

| | | | |
|---|---|---|---|
| JP | 02226785 A | 9/1990 | H05K/1/02 |
| JP | 03195079 A | 8/1991 | H05K/1/02 |
| JP | 04313289 A | 11/1992 | H05K/1/03 |
| WO | WO 99/07014 | 2/1999 | H01L/23/31 |

\* cited by examiner

Primary Examiner—Neil Abrams
(74) Attorney, Agent, or Firm—John A. Jordan; Arthur J. Samodovitz

(57) ABSTRACT

The effect upon reliability of thickness variation in a printed wiring board at the LGA compression connection site of an electronic module is reduced. Plated through holes formed in a printed wiring board at the mounting site of an electronic module typically result in upper and lower opposing surface depressions in the board at this mounting site. When compressional force is applied for compressional connection of the module to the printed wiring board through an interposer, the board deforms downwardly reducing the lower depression and increasing the upper depression beyond the compliance of the interposer. Filler material, such as, a bonding material is employed to fill the lower depression eliminating the downward deformation of the printed wiring board into the lower depression. A quantity of filler material sufficient to deform the printed wiring board upwardly under pressure into the upper depression thereby reducing or eliminating same may also be used.

20 Claims, 4 Drawing Sheets

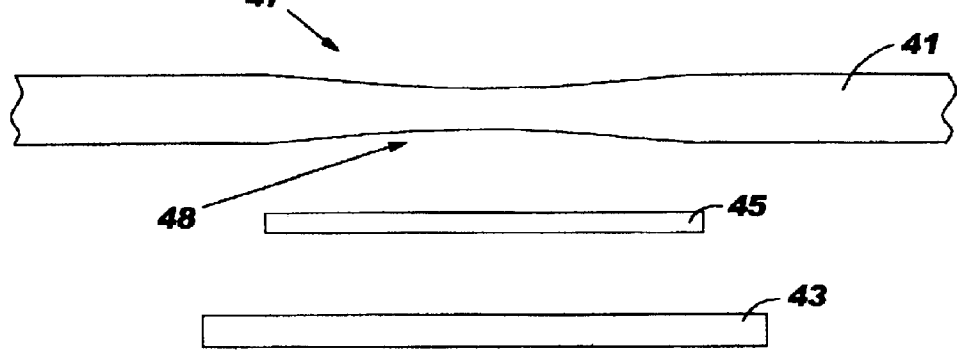
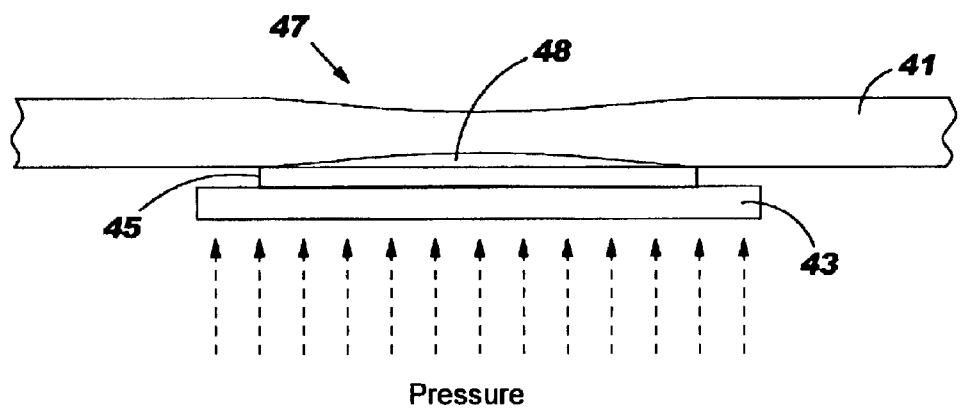
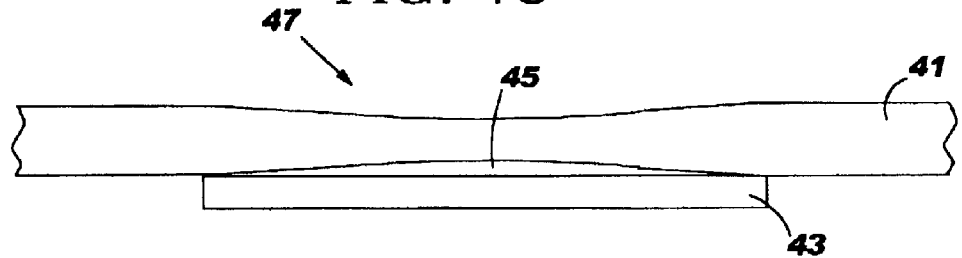

PRINTED WIRING BOARD THICKNESS CONTROL FOR COMPRESSION CONNECTORS USED IN ELECTRONIC PACKAGING

BACKGROUND OF THE INVENTION

1. Field of the Invention

The present invention relates to electronic packaging. More particularly, the present invention relates to compression connectors, such as land grid array (LGA) connectors used to make electrical connection of modules to a printed wiring board.

2. Background and Related Art

Compression connectors, such as those employed in LGA connections and compression pad on pad (CPOP) type connectors, are well known in the art. Typical LGA compression connections employ an interposer to connect a multiple chip module (MCM) to a printed wiring board (PWB). The MCM generally comprises multiple integrated circuits or chips assembled into a subsystem the size of traditional single chip packages. The MCM is connected to the PWB through the interposer with the MCM circuit pads making contact with the array of connectors on one surface of the interposer and the PWB circuit pads making contact with the array of connectors on the other surface of the interposer. Compression forces are employed to hold the MCM and PWB against the interposer. Typical examples of such LGA compression connections can be seen by reference to U.S. Pat. Nos. 5,473,510 and 5,703,753.

Such compression connections may take a variety of particular packaging forms, such as shown in the above examples, but a common feature is to employ compressional force to hold the connectors and contact pads together. However, the typical compressional force required to provide reliable surface contact may, at times, create problems due to irregularities in surface profile of, for example, the PWB. More particularly, the compressional force required to provide good surface contact between mating pads and interposer connectors may further act to deform the PWB because of the irregularities in the surface profile of the non-mating surface of the PWB thereby compounding the irregularities and their effect.

It is known, that LGA interconnects also require relatively uniform surface contact between mating pads and LGA conductors across the array of pads to achieve reliable electrical connection. Accordingly, this necessitates not only a constant and uniform compressive force, but also some degree of conforming uniformity of the surface profile of the MCM and PWB. Thus, the uniformity of the thickness of the PWB, in particular, becomes a factor in achieving uniform compressive contact between mating pads and LGA conductors across the array.

It has been found, however, that the thickness of PWBs varies due to inherent design and manufacturing features. Compression-type connections in the PWB typically employ an array of Plated Through Holes (PTHs) with lands or pads around them as the contact surface for the interposer conductors to mate with. When the PTHs are made in a field or an array at the module site, the thickness of the PWB tends to be thinner in the region of the field or array of PTHs than in regions not having the PTHs. This is due to what may be called the "laminating effect".

The laminating effect is due to the fact that clearances in the power planes are required for isolation of the PTHs at various levels. Typically, such clearances require resin to fill in and form the power plane clearances as well as any other voids in the various layers of the PWB. However, the distance resin is able to flow is limited and does not flow through the complete module site to prevent reduction in thickness of the PWB in these PTH field or array regions. In addition, electroplated pads of a non-uniform plating thickness distribution may develop such that the outer area of the field or array of PTHs may be thicker than the center portion thereby compounding the laminating effect.

It has been found that this laminating effect forms gradual recesses or depression on opposing upper and lower surfaces of the PWB that can vary board thickness in the range of 2 to 7 mils, depending upon the PWB design and manufacture. However, the compliance of a typical LGA interposer, i.e., the amount of thickness variation the array of mating conductors thereon can effectively accommodate and still maintain good electrical contact, is around 2 to 4 mils. It should be understood that this thickness variation results in a depression occurring on each of the opposing surfaces of the PWB in range of 1 to 3.5 mils, and when compression of the PWB occurs, the upper depression of the PWB can deform into the lower depression forming an upper depression approximately two time that of its relaxed state.

SUMMARY OF THE INVENTION

Accordingly, it is an object of the present invention to provide an arrangement for thickness and surface profile control of laminate PWBs.

It is a further object of the present invention to provide an improved compression connection arrangement for LGA connection of electronic apparatus to a PWB.

It is a further object of the present invention to provide an improved connection method and structure for connecting a MCM to a PWB.

It is yet a further object of the present invention to provide an arrangement for thickness control for compression connectors used in electronic packaging.

It is still yet a further object of the present invention to provide a method and structure for thickness control of PWBs in compression connection of a module thereto.

It is another object of the present invention to provide an arrangement to compensate for thickness variations in a laminate PWB so as to provide improved electrical connection of a MCM in a LGA compression connection arrangement to the PWB.

In accordance with the present invention, thickness and surface profile variations in a PWB are controlled with the use of filler material. More particularly, thickness reduction in PWBs caused by fabrication processes in the region of electrical contact to an electronic module is corrected to provide effective electrical contact using compression connection techniques.

As stated above, the initial formation of PTHs and contact pads at the site of electronic module contact connection to a PWB act to cause a thickness reduction at the contact site as compared to the thickness of the surrounding region. The thickness reduction results in a gradual recess or depression on opposing upper and lower surfaces at the contact site of the PWB. Such depressions at the contact site cause difficulty in making good electrical contact between module and PWB using an interposer and compression connection techniques. The extent of the depression in the PWB is compounded when compressive forces are applied for the compression connection.

In accordance with the present invention, filler material, such as a bonding material, are employed between the PWB backside support and PWB at the site of the lower recess to correct for the thickness variation. Various amounts, types and shapes of filler material may be employed. Such material acts to reduce surface profile and thickness variation in the PWB and its concomitant effect of preventing relatively uniform and complete compression contact between the electronic module and PWB through an LGA interposer.

These foregoing and other objects, features and advantages of the invention will be apparent from the following more particular description of a preferred embodiment of the invention, as illustrated in the accompanying drawings, wherein like reference members represent like parts of the invention.

BRIEF DESCRIPTION OF THE DRAWINGS

FIGS. 4A–C shows a cross-sectional view of PWB with filler material and backside stiffener support.

DETAILED DESCRIPTION

Figure 1:
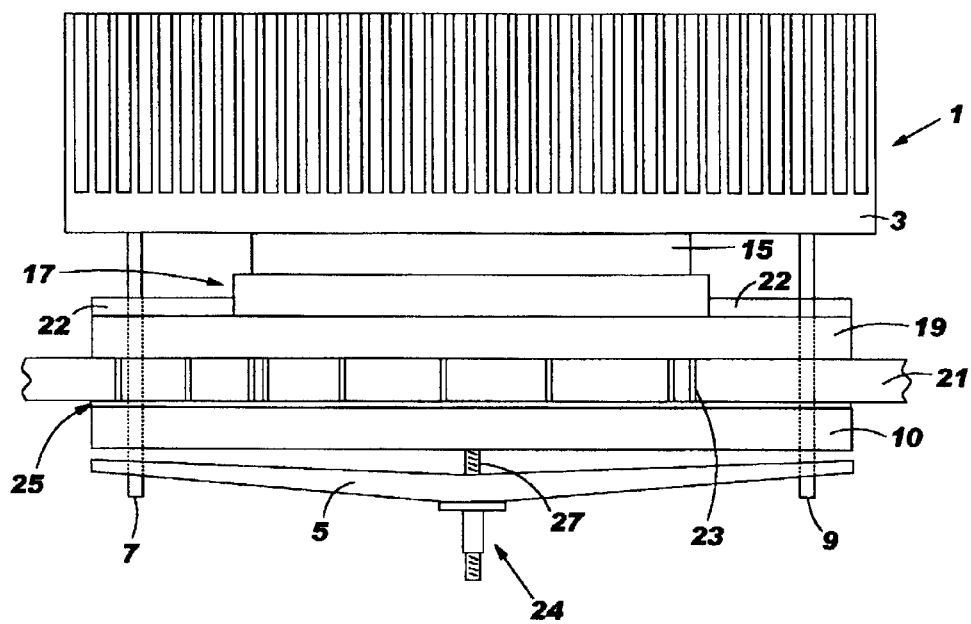
FIG. 1 shows a cross-sectional view of a LGA electronic module/PWB compression connection assembly.

With reference to FIG. 1, there is shown a cross-section of a typical MCM assembly 1 wherein an array of conductors (not shown) extending to opposing surfaces of an LGA connector or interposer are held in conductive relationship with contact pads (not shown) of an electronic module, such as, an MCM at one surface, and contact pads of a PWB, at the other surface. In this arrangement, heat sink 3 acts to hold the assembly in compressive force using a pair of pins 7 and 9 that extend through the various components including local stiffening layer 10 and are engaged with spring plate 5 to thereby clamp the assemble together. Stiffening layer 10 may comprise any of a variety of stiff materials, such as, a metal, polymer or ceramic formed, for example, in a plate-like structure.

Heat sink 3 is in thermal contact with module cap 15 and module cap 15 is in thermal contact with electronic module 17. Module 17 may include single or multiple chips electrically connected to an array of contact pads on the bottom surface of the module which contacts are, in turn, in contact with a corresponding matching array of conductors on LGA interposer 19. The matching array of contact pads on module 17 and PWB 21, as well as the conductors on LGA interposer 19, are shown in more detail in the exploded cross-sectional view of FIG. 2.

Figure 2:
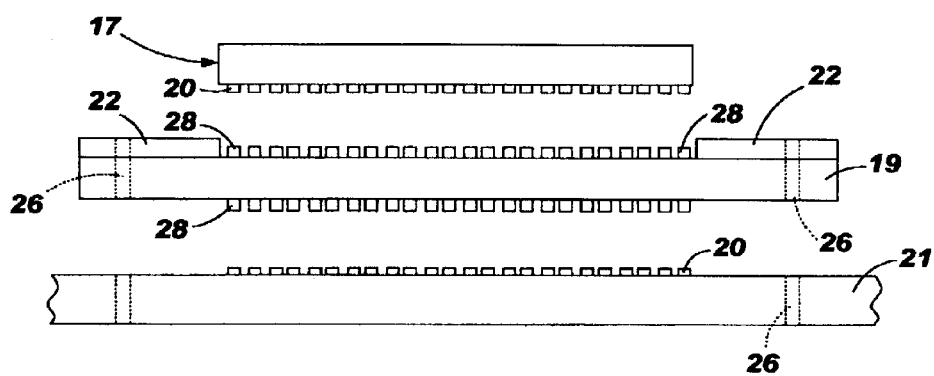
FIG. 2 shows an exploded cross-sectional view of an LGA interposer between electronic module and an idealized PWB.

In FIG. 2, PWB 21 is shown, for purposes of general description, in an idealized form without thickness variation. The array of aligned LGA contact conductors 28 on interposer 19 are for illustrative purposes only. In practice, the number and type of conductors may vary. The module 17 is aligned to interposer 19 by the inner edge of alignment features 22 in the frame portion of interposer 19. Interposer 19 is, in turn, aligned through holes 26 in FIG. 2 which accept pins 7 and 9 of heat sink 3, as shown in FIG. 1. Interposer 19 may comprise a single layer of rigid or flexible dielectric material or may comprise several layers of such material formed together.

The layer of dielectric material for the interposer is typically arranged to hold an array of conductors 28 extending therethrough and beyond opposing surfaces such that when pressure is applied to the array of conductors, electrical connection is made between the conductors on each side to matching conductive pads on, for example, an electronic module on one side and a PWB on the other. An example of such interposer is one made by Cinch, a division of Labinal Components and Systems, Inc., using so-called "wadded wire" conductors for the array of conductors. Such conductors comprise gold plated molybdenum wool which fills vias through the interposer material to provide somewhat compressible conductive pathways. Other commercially available interposers employ, for example, the so called Z-flex interposer technology. Such technology employs Z-shaped wires embedded in an elastomer which establish connection upon application of pressure.

Again, with reference to the cross-sectional view of FIG. 1, PWB 21 shows, for illustrative purposes only, various PTHs 23 which extend to metallurgy on its underside. In contact with the underside of PWB 21 is a layer of insulation 25 positioned between the PWB 21 underside and stiffening layer 10. Spring plate 5 has a fixed-stop activation screw assembly 24 to bring the spring plate screw 27 up against stiffener 10 so as to provide the degree of compression necessary to ensure effective contact between mating LGA conductors of the assembly.

Figure 3:
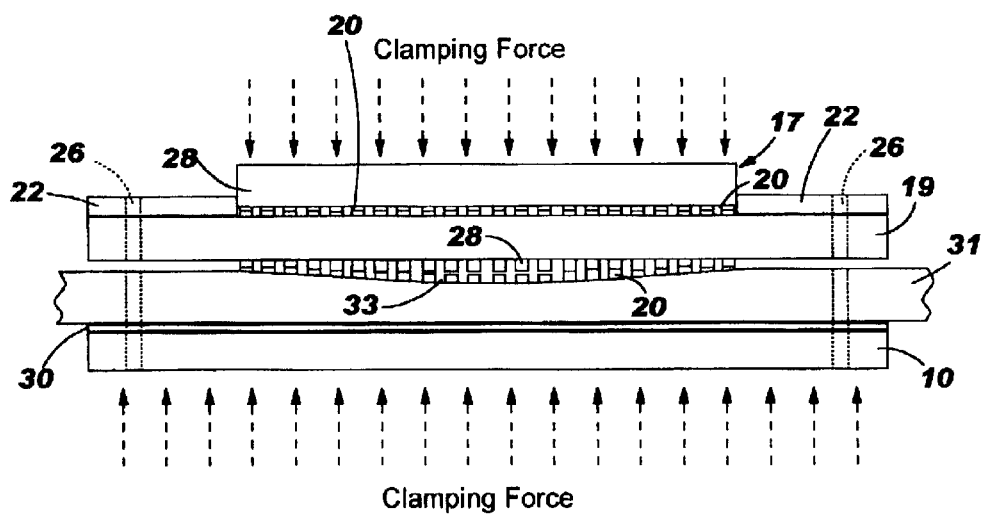
FIG. 3 shows a cross-sectional view of an LGA interposer between module and an actual PWB when clamping force is applied.

With reference to FIG. 3, there is shown an actual PWB with a gradual recess or depression region 33 created by both thickness variation and the effect of clamping force used to make compressive connection to interposer 19, as described above. FIG. 4A shows PWB 41 in a relaxed state where opposing gradual recesses or depressions 47 and 48 are created by thickness variation due to PTH formation, as hereinabove described.

As can be seen in FIG. 3, the clamping force results in deforming PWB 31 into the recess region corresponding to recess 48 in FIG. 4A, so that the bottom surface of PWB 31 is relatively flat against plate insulator layer 30 and plate 10. The effect of this is to increase the depth of recess 33 to approximately double that of its relaxed state.

As further shown in FIG. 3, this may put some of the pads 20 on PWB 31 out of reach of some of conductors 28 on interposer 19. Alternatively, all of the pads may make contact but will not make contact with sufficient uniform force across the array to provide an effective connection.

With reference to FIG. 4A, there is shown an exploded view of a typical PWB 41 with thickness variation along with stiffening layer 43 and filler material 45, in accordance with the present invention. As hereinabove described, the thickness variation shown at recesses or depressions 48 and 49 is attributed to the requirements of PTH formation. Although not shown here, the non-uniformity in the surface profile of PWB 41 may be compounded by diminishing plating thickness of contact pad formation from the outer pads toward inner pads. This combined thickness variation can very PWB thickness in the range of 2 to 7 mils depending upon PWB design and manufacture. The compliance of interposer 19 can typically accommodate 2 to 4 mils. This compliance is primarily a function of the compliant conductors extending beyond each of the surfaces of the interposer. This design mismatch creates incomplete and/or non-uniform contact of the electrical contacts of the PWB, as shown in FIG. 3, and such conditions cause reliability problems.

In accordance with the present invention, in the arrangement shown in FIG. 4A, filler material 45 is employed to overcome the design mismatch. Filler material may comprise any of a variety of resilient and malleable materials which, when compressed, will conform to recess 48. The volume of resilient material employed should generally match the volume of recess 48. Obviously, where the resilient material is compressible, additional volume of material may be required. As shown in FIG. 4B, when pressure is applied to stiffening layer 43, the material conforms to the recess, as shown in FIG. 4C.

Thus, with recess 48 filled and in contact with stiffening layer 43, the thickness variation of PWB 41 is essentially cut in half. This prevents PWB 41 from yielding into recess 48 when compression is applied to the overall assembly, as shown in FIG. 3. But for filler material 45, PWB 41 would yield to the force of some of the outer conductors of LGA interposer 19, and deflect into recess 48 thereby positioning some of the contact pads 20 on PWB 41 out of the range to which some of the inner conductors 28 of LGA interposer 19 can effectively accommodate compliance, as shown in FIG. 3.

Filler material 45 may comprise a bonding material which, under the pressure step as shown in FIG. 4B, bonds to stiffening layer 43. A metallurgical-like solder or an epoxy such as, Epoxy Systems #652 or 3M Scotch Weld epoxy adhesive 1751 B/A could be used. In addition, filler material may also be selected such as to bond to both stiffening layers 43 and PWB 41. Examples of such material are various types of adhesives and epoxies, such as, 3M Scotch Weld epoxy adhesive 1838 B/A. Such materials may be solidified to the general shape of the layer 45 shown in FIG. 4B. Alternatively, the material may take any of a variety of shapes, such as a mound, which will under pressure, spread and bond to both the surface of stiffening layer 43 and the surface of recess 48 of PWB 41. It is clear, that where the filler material bonds to stiffening layer 43, then this layer is used as layer 10 in FIGS. 1, 3 and 5.

Figure 5:
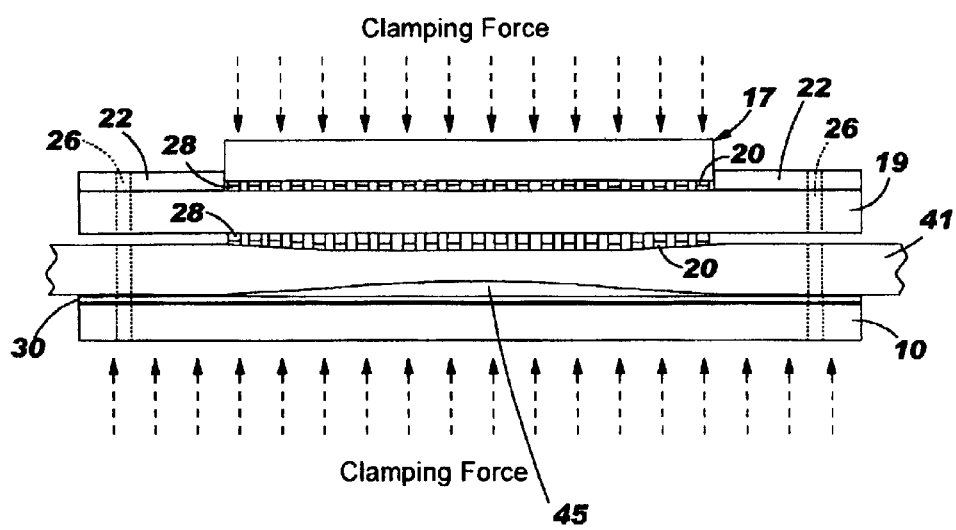
FIG. 5 shows a cross-sectional view of the result of applying the clamping force to the arrangement of FIG. 4C.

FIG. 5 shows a partial cross-sectional view of the shape of LGA interposer 41 when the assembly is clamped together using filler material 45, as described in FIG. 4. As shown in FIG. 5, filler material 45 acts to cause PWB 41 to maintain its shape under compression and allows the LGA conductors 28 of interposer 19 to make a more uniform and effective contact with the pads 20 of PWB 41. By such an arrangement, interposer 19 operates within its compliance range.

It is also possible to employ a sufficient amount of bonding filler material 45, as shown in FIG. 4B, so as to cause PWB 41 to deform upwardly under compression pressure to eliminate recess 47 and thereby form a relatively flat surface on PWB 41. This may be accomplished by employing a volume of filler material equal to the sum of the volumes of recesses 47 and 48. A volume of filler material greater than the volume of recess 48 but less than the sum of the volumes of the two recesses could also be used.

Alternatively, a volume of filler material 45 may be employed such as to be greater than the sum of the volumes of recesses 47 and 48 so as to cause PWB 41 to deform, under compression, upwardly to a convex surface at the site of PWB recesses. Such convex surface may be useful to accommodate a particular module or MCM contact pad profile, such as a concave profile. Thus, variations in PWB surface between such convex surface, and the concave surface shown at recess 47, may be implemented, depending upon the particular application.

It will be understood from the foregoing description that various modifications and changes may be made in the preferred embodiment of the present invention without departing from its true spirit. It is intended that this description is for purposes of illustration only and should not be construed in a limiting sense. The scope of this invention should be limited only by the language of the following claims.

What is claimed is:

1. An electronic assembly, comprising:
    a printed wiring board having an upper and lower surface with said upper surface having an array of contact pads at least at one region thereof for mounting an electronic module at said region with said region exhibiting less printed wiring board thickness than surrounding regions;
    a layer of stiffening material positioned against said lower surface of said printed wiring board;
    a layer of filler material positioned between said layer of stiffening material and said lower surface of said printed wiring board within said region of said printed wiring board exhibiting said less thickness;
    an electronic module having an array of contact pads;
    an interposer having an array of conductors extending through one surface matching said array of contact pads on said printed wiring board and extending through the other surface matching said array of contact pads on said electronic module; and
    means to apply a compressional force between said electronic module and said layer of stiffening material to compress said array of conductors extending through the said other surface of said interposer against said array of contact pads of said electronic module and to compress said array of conductors extending through the said one surface of said interposer against said array of contact pads on said printed wiring board with said filler material acting to prevent said printed wiring board from deforming against said layer of stiffening material.

2. The electronic assembly as set forth in claim 1 wherein said region of said printed wiring board exhibiting said less thickness comprises opposing surface depressions in said upper and lower surface of said printed wiring board in the uncompressed state and wherein the volume of said layer of filler material is less than the volume of said recess in said lower surface.

3. The electronic assembly as set forth in claim 2 wherein the said volume of said layer of filler material is approximately equal to the volume of said recess in said lower surface.

4. The electronic assembly as set forth in claim 2 wherein the said volume of said layer of filler material is greater than the volume of said recess in said lower surface.

5. The electronic assembly as set forth in claim 1 wherein said layer of filler material comprises a bonding material.

6. The electronic assembly as set forth in claim 5 wherein said bonding material is a metallurgical material.

7. The electronic assembly as set forth in claim 5 wherein said bonding material is an adhesive material.

8. The electronic assembly as set forth in claim 5 wherein said bonding material is an epoxy material.

9. The electronic assembly as set forth in claim 3 wherein said layer of filler material comprises a bonding material which is bonded to said layer of stiffening material.

10. The electronic assembly as set forth in claim 9 wherein said bonding material is bonded to both said layer of stiffening material and said printed wiring board.

11. The electronic assembly as set forth in claim 10 wherein said layer of stiffening material comprises an insulating layer joined to a stiffening plate with said insulating layer positioned against said printed wiring board.

12. The electronic assembly as set forth in claim 1 wherein said module is a multichip module.

13. The electronic assembly as set forth in claim 12 wherein said interposer comprises an LGA compliance interconnect structure.

14. A method of correcting for the effect of thickness variation due to upper and lower opposing surface depressions at a module connection site of a printed wiring board, comprising the steps of:

positioning a filler material at said lower depression of said opposing surface depressions of said printed wiring board;

placing a stiffening layer in contact with said filler material; and applying pressure to said stiffening layer to compress said filler material into said lower depression to approximately fill said depression.

15. The method as set forth in claim 14 wherein the volume of said filler material is approximately equal to the volume of said lower depression.

16. The method as set forth in claim 15 wherein said filler material is a bonding material that bonds to both said stiffening layer and printed wiring board.

17. The method as set forth in claim 16 wherein said bonding material is a metallurgical material.

18. The method as set forth in claim 16 wherein said bonding material is an epoxy material.

19. The method as set forth in claim 14 wherein the volume of said filler material is greater than the volume of said lower depression such that upon said step of applying pressure said upper depression is reduced due to upward deformation of said printed wiring board in response to said pressure against said filler material.

20. The method as set forth in claim 19 wherein said printed wiring board deforms upwardly beyond the plane of the surface of said printed wiring board.

* * * * *